United States Patent
Chang et al.

(10) Patent No.: US 9,268,187 B2
(45) Date of Patent: Feb. 23, 2016

(54) LIQUID CRYSTAL DISPLAY DEVICE AND METHOD OF REPAIRING BAD PIXELS THEREIN

(71) Applicant: SAMSUNG DISPLAY CO., LTD., Yongin, Gyeonggi-Do (KR)

(72) Inventors: Jong-woong Chang, Asan-si (KR); Shin-tack Kang, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/799,468

(22) Filed: Jul. 14, 2015

(65) Prior Publication Data
US 2015/0316826 A1   Nov. 5, 2015

Related U.S. Application Data

(63) Continuation of application No. 14/606,941, filed on Jan. 27, 2015, which is a continuation of application No. 13/844,256, filed on Mar. 15, 2013, now Pat. No. 8,976,331, which is a continuation of application No. 13/224,150, filed on Sep. 1, 2011, now Pat. No. 8,400,609, which is a continuation of application No. 12/534,537, filed on Aug. 3, 2009, now Pat. No. 8,045,075, which is a continuation of application No. 11/934,656, filed on Nov. 2, 2007, now Pat. No. 7,580,108.

(30) Foreign Application Priority Data

Nov. 3, 2006  (KR) .................. 10-2006-0108410

(51) Int. Cl.
| | | |
|---|---|---|
| G02F 1/1333 | (2006.01) | |
| G02F 1/1362 | (2006.01) | |
| G02F 1/1368 | (2006.01) | |
| H01L 27/12 | (2006.01) | |
| H01L 29/786 | (2006.01) | |
| H01L 29/417 | (2006.01) | |

(52) U.S. Cl.
CPC ........ G02F 1/136259 (2013.01); G02F 1/1368 (2013.01); G02F 1/133345 (2013.01); G02F 1/136286 (2013.01); H01L 27/1244 (2013.01); H01L 29/41733 (2013.01); H01L 29/78603 (2013.01); G02F 2001/136263 (2013.01)

(58) Field of Classification Search
CPC ............... G02F 1/136259; G02F 2001/136263
See application file for complete search history.

(56) References Cited

U.S. PATENT DOCUMENTS

| | | | |
|---|---|---|---|
| 6,555,876 | B2 | 4/2003 | Jun et al. |
| 7,339,633 | B2 | 3/2008 | Jeoung et al. |

(Continued)

FOREIGN PATENT DOCUMENTS

| | | |
|---|---|---|
| CN | 1573487 A | 2/2005 |
| CN | 1580922 A | 2/2005 |

(Continued)

*Primary Examiner* — Phu Vu
(74) *Attorney, Agent, or Firm* — Innovation Counsel LLP

(57) ABSTRACT

A liquid crystal display device and a method of repairing bad pixels thereof, in which the bad pixels can be efficiently and easily repaired, includes a first insulating substrate, a gate wiring and a storage wiring arranged substantially parallel to each other in a first direction on the first insulating substrate, a data wiring intersecting the gate and storage wirings in an insulated manner and arranged substantially in a second direction, and a pixel electrode formed on a pixel area defined by the gate and data wirings. The storage wiring includes a horizontal portion arranged substantially in the first direction and at least a part of which does not overlap the pixel electrode, and a vertical portion branching off substantially in the second direction from the horizontal portion and overlapping the data wiring.

1 Claim, 14 Drawing Sheets

(56) References Cited

U.S. PATENT DOCUMENTS

| | | |
|---|---|---|
| 7,580,108 B2 | 8/2009 | Chang et al. |
| 7,700,949 B2 | 4/2010 | Song et al. |
| 8,045,075 B2 | 10/2011 | Chang et al. |
| 8,400,599 B2 | 3/2013 | Chang et al. |
| 2002/0145695 A1 | 10/2002 | Kim et al. |
| 2003/0071951 A1 | 4/2003 | Jun |

FOREIGN PATENT DOCUMENTS

| | | |
|---|---|---|
| CN | 1758125 A | 4/2006 |
| JP | 03-056942 A | 3/1991 |
| JP | 03-171034 | 7/1991 |
| JP | 04-090513 | 3/1992 |
| JP | 05-241192 | 9/1993 |
| JP | 07-113731 B2 | 5/1995 |
| JP | 08-201847 A | 8/1996 |
| JP | 08-320466 | 12/1996 |
| JP | 10-239699 A | 9/1998 |
| JP | 10-260430 A | 9/1998 |
| JP | 11-038449 A | 2/1999 |
| JP | 11-202316 A | 7/1999 |
| JP | 2001-100249 A | 4/2001 |
| JP | 2001-194688 A | 7/2001 |
| JP | 2001-281690 A | 10/2001 |
| JP | 2001-330832 A | 11/2001 |
| JP | 2001-332742 A | 11/2001 |
| JP | 2002-031816 A | 1/2002 |
| JP | 2002-196338 A | 7/2002 |
| JP | 2003-078143 A | 3/2003 |
| JP | 2003-273365 A | 9/2003 |
| JP | 2006-106660 A | 4/2006 |
| JP | 2008-046625 A | 2/2008 |
| JP | 2008-116912 A | 5/2008 |
| KR | 100149300 | 6/1998 |
| KR | 10-1999-072286 A | 9/1999 |
| KR | 10-2004-0018883 A | 3/2004 |
| KR | 10-2004-0026959 A | 4/2004 |
| KR | 10-2005-0105591 A | 11/2005 |

LIQUID CRYSTAL DISPLAY DEVICE AND METHOD OF REPAIRING BAD PIXELS THEREIN

CROSS REFERENCE

This patent application is a Continuation application of U.S. application Ser. No. 14/606,941 filed Jan. 27, 2015, which is a continuation of U.S. application Ser. No. 13/844, 256 filed Mar. 15, 2013, which is a continuation of U.S. application Ser. No. 13/224,150 filed Sep. 1, 2011 (now U.S. Pat. No. 8,400,609), which is a continuation of U.S. application Ser. No. 12/534,537 filed Aug. 3, 2009 (now U.S. Pat. No. 8,045,075), which is a continuation of U.S. application Ser. No. 11/934,656 filed Nov. 2, 2007 (now U.S. Pat. No. 7,580, 108), which application claims priority from Korean Patent Application No. 10-2006-0108410 filed on Nov. 3, 2006 in the Korean Intellectual Property Office, the disclosures of which are incorporated herein by reference in their entirety.

BACKGROUND

1. Field of the Invention

The present invention relates to an image display device and, more particularly, to a liquid crystal display device and a method of repairing bad pixels therein.

2. Description of the Prior Art

The cathode ray tube (CRT), liquid crystal display (LCD), plasma display panel (PDP) apparatus, electronic paper display (EPD), and so forth are examples of commonly used image display devices that are being developed to the meet demand for miniaturization, weight reduction, and low power consumption.

A liquid crystal display includes a color filter substrate having a color filter, a thin film transistor ("TFT") substrate having a TFT array, and a liquid crystal layer interposed between the color filter substrate and the TFT substrate.

The TFT substrate of the LCD includes a plurality of gate lines, a plurality of storage wirings, a plurality of data lines, a pixel electrode and others. There is a concern that an open may occur in the individual wirings or a that a short between the wirings may occur. If one data line is opened, all pixels in a column connected to that data line will not operate.

When pixel defects occur, a process of repairing the pixel defects is generally performed, but the process may give rise to further pixel defects, for example, a short between wirings overlapping each other. As such, a method is needed that efficiently and easily repairs bad pixels without causing any other pixel defects.

SUMMARY

Accordingly, to an aspect of the present invention ran exemplary embodiment provides an LCD device where bad pixels to be efficiently and easily repaired.

The exemplary embodiments of the present invention further provide a method of repairing bad pixels in such an LCD device.

In an exemplary embodiment a liquid crystal display device includes: a first insulating substrate; a gate wiring and a storage wiring arranged substantially parallel to each other in a first direction on the first insulating substrate; a data wiring intersecting the gate and storage wirings in an insulated manner, and arranged substantially in a second direction; and a pixel electrode formed on a pixel area defined by the gate and data wirings, wherein the storage wiring includes a horizontal portion arranged substantially in the first direction and at least a part of which does not overlap the pixel electrode, and a vertical portion branching off substantially in the second direction from the horizontal portion and overlapping the data wiring.

In accordance with another exemplary embodiment, a method of repairing bad pixels of a liquid crystal display device comprises: providing the thin film transistor substrate having gate wiring and a storage wiring arranged substantially parallel to each other in a first direction on an insulating substrate, data wiring intersecting but insulated from the gate and storage wirings and arranged substantially in a second direction, a pixel electrode formed on a pixel area defined by the gate and data wirings, wherein the storage wiring comprises a horizontal portion arranged substantially in the first direction and at least a part of which does not overlap the pixel electrode, and a vertical portion branching off substantially in the second direction from the horizontal portion and overlapping the data wiring; and cutting the storage wiring by irradiating a laser beam onto a part of the horizontal portion that does not overlap the pixel electrode.

BRIEF DESCRIPTION

The above and other objects, features and advantages of the present invention will be apparent from the following detailed description taken in conjunction with the accompanying drawings, in which.

DETAILED DESCRIPTION OF THE EMBODIMENT(S)

It should be noted that the term "on", as mentioned herein, is used not only in the case where elements or layers are directly on other elements or layers, but also in the case where other intermediate elements or layers intervene therebetween. In contrast, the term "directly on", as mentioned herein, means that elements or layers are on other elements or layers without any other intermediate elements or layers intervening therebetween. Like numbers designate like elements throughout the specification and drawings.

Spatially relative terms such as "below", "beneath", "lower", "above" and "upper" may be used herein for easily describing correlations between one element or constituents and other elements or constituents, as illustrated in the figures. It should be appreciated that the spatially relative terms are intended to encompass different orientations of the element in use or operation in addition to the orientation depicted in the figures. Like numbers designate like elements throughout the specification and drawings.

Figure 1:
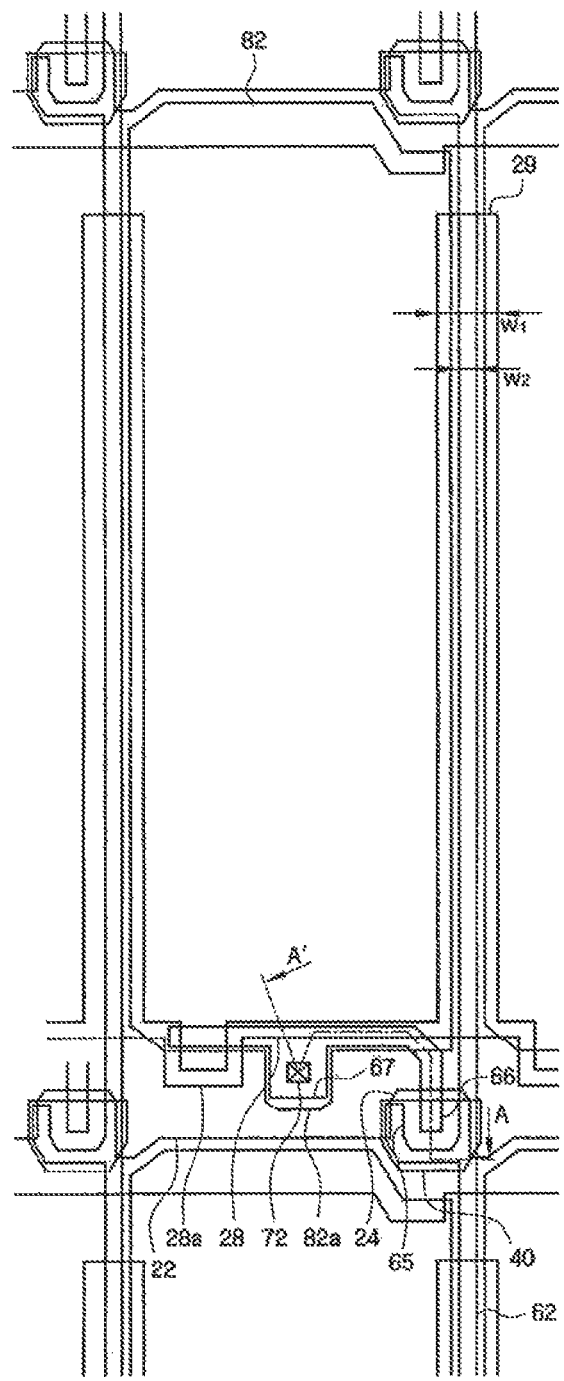
FIG. 1 is a layout view of a TFT substrate included in an LCD device in accordance with a first preferred embodiment of the present invention.
Figure 2:
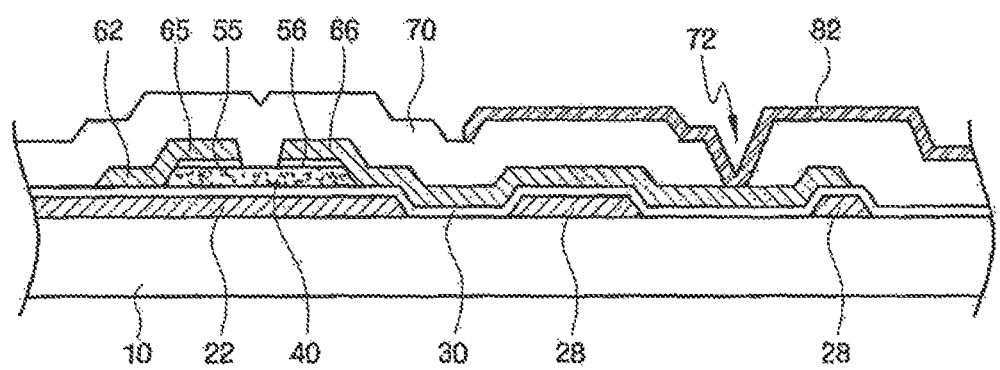
FIG. 2 is a sectional view taken along line A-A' of FIG. 1.

Reference will now be made to a first preferred embodiment of the present invention with reference to FIGS. 1 to 5. FIG. 1 illustrates the layout of a TFT substrate included in an LCD device according to the first embodiment of the present invention. FIG. 2 illustrates a section taken along line A-A' of FIG. 1. FIG. 2 illustrates the layout of a color filter substrate included in the LCD device according to the first embodiment of the present invention. Finally, FIG. 5 illustrates a section taken along line B-B' of FIG. 4.

Figure 4:
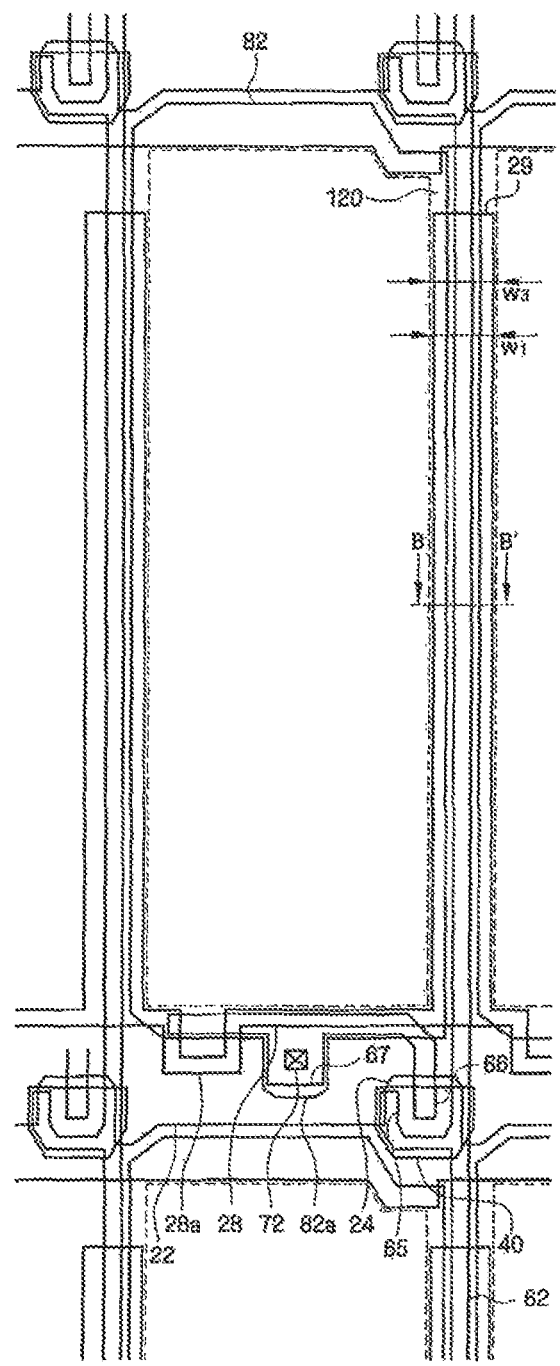
FIG. 4 is a layout view of the LCD device in accordance with the first preferred embodiment of the present invention.
Figure 5:
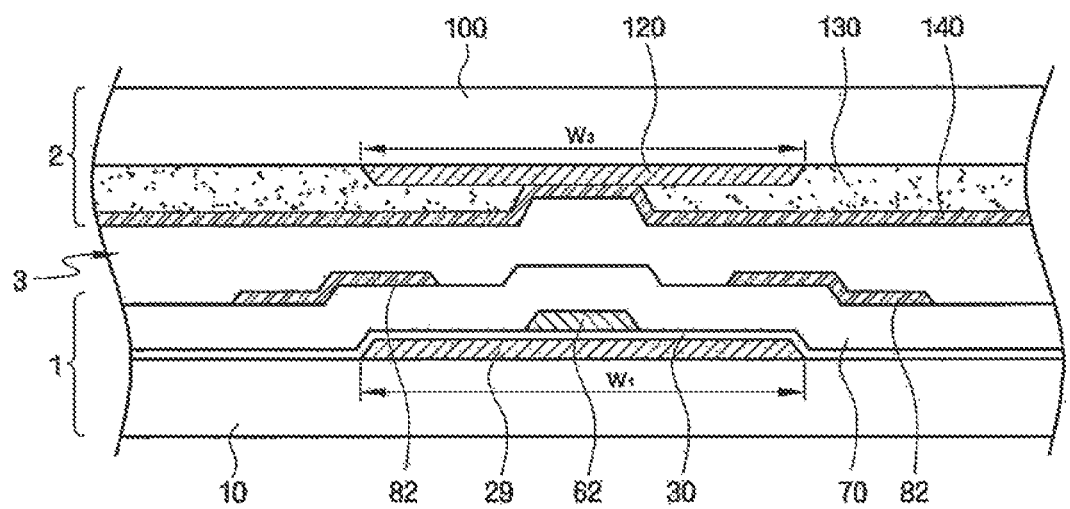
FIG. 5 is a sectional view taken along line B-B' of FIG. 4.

As illustrated in FIGS. 4 and 5, the LCD device according to the first embodiment of the present invention includes a TFT substrate, a color filter substrate opposite thereto, and a liquid crystal layer 3 formed between these two substrates, and oriented in a certain direction.

First, a detailed description of the TFT substrate will be given with reference to FIGS. 1 and 2.

The TFT substrate according to the first embodiment of the present invention includes a gate wiring 22 and 24, a storage wiring 28 and 29, a gate insulating film 30, an active layer 40, an ohmic contact layer 55, 56, a data wiring 62, 65, 66, and 67, a protective film 70, a pixel electrode 82 and the like, all of which are formed on a first insulating substrate 10.

The first insulation substrate 10 may be made of heat-resistant, optically transparent material such as transparent glass or plastic.

The gate wiring 22 and 24 and the storage wiring 28 and 29 are formed on the first insulating substrate 10, and are arranged substantially parallel to each other in a first direction. The gate wiring 22 and 24 and the storage wiring 28 and 29 may be formed on the same layer, for example, on the first insulating layer 10.

The gate wiring 22 and 24 includes a gate line 22 and a gate electrode 24. The gate line 22 is arranged substantially in the first direction, for example, in a transverse direction, and transmits a gate signal. The gate electrode 24 projects from the gate line 22 in the form of a protrusion and constitutes three terminals of a TFT, together with a source electrode 65 and a drain electrode 66, as will be described below.

The storage wiring 28 and 29 includes a horizontal portion 28 and a vertical portion 29. The horizontal portion is arranged substantially parallel to the gate wiring 22 and 24 in the first direction. The vertical portion 29 branches off substantially in a second direction and overlaps the data wiring 62, 65, 66, and 67, as will be described below.

A storage voltage is applied to the storage wiring 28 and 29, which forms a storage capacitor together with the pixel electrode 82, as will be described below. In accordance with an aspect of the invention, the storage wiring 28 and 29 also functions to repair pixel defects.

The horizontal portion 28 is arranged parallel to and spaced from the gate wiring 22 and 24, and in particular, the gate line 22. The horizontal portion 28 is disposed to overlap the pixel electrode 82, as will be described below, and thus the storage capacitor is formed between the pixel electrode 82 and the horizontal portion 28.

At least apart of the horizontal portion 28 does not overlap the pixel electrode 82. Specifically, the horizontal portion 28 is generally parallel to the gate line 22, but a bent portion 28a projecting beyond an edge of the pixel electrode 82 is formed in a part of the horizontal portion 28 such that the part of the horizontal portion 28 does not overlap the pixel electrode 82. The bent portion 28a is bent toward the gate line 24 adjacent to the horizontal portion 28, but does not overlap the gate wiring 22 and 24, and the data wiring 62, 65, 66, and 67. Although the bent portion 28a is U-shaped in the present embodiment, it may take other shapes such as a circular arc shape, a ridge shape, and others, so long as it does not overlap the pixel electrode 82. Various modifications may be made to its shape. In this way, since the storage wiring 22, 24 includes the bent portion 28a not overlapping the pixel electrode 82, it is possible to efficiently repair an open or a short when the open or the short occurs in the data line 62 and the pixel electrode. Such a method of repairing bad pixels of the LCD device will be described in detail in the following.

From the above-mentioned horizontal portion 28, the vertical portion 29 branches off substantially in a second direction, for example, in a longitudinal direction. Specifically, the horizontal portion 28 may be arranged parallel to and along the long side of the TFT substrate in a transverse direction, and a plurality of vertical portions 29 may branch off from each horizontal portion 28 and be arranged parallel to the short side of the TFT substrate in a longitudinal direction.

The vertical portion 29 branches off from the horizontal portion 28, and is formed in such a manner that the distal end of the vertical portion 29 adjoins the gate line 22 of an adjacent pixel, but is spaced from the gate line 22 of the adjacent pixel such that it is not electrically connected thereto.

The vertical portion 29 overlaps the data line 62 as will be described below, and is used for repairing an open or a short of the data line 62. A description thereof will also be given to explain a method of repairing bad pixels of the LCD device according to the present embodiment.

The vertical portion 29 is so formed as to have a wider width $W_1$ than the width $W_2$ of the data line 62, which facilitates repair of the data line 62. Edges of the vertical portion 29 overlap the pixel electrode 82 along the second direction, for example, along a longitudinal direction, thereby preventing light emitted from a backlight assembly (not shown) from leaking. That is, the vertical portion 29 overlaps a pair of pixel electrodes 82 adjacent to each other. Further, referring to FIG. 3, the vertical portion 29 has the same width $W_1$ as the width $W_3$ of a black matrix 120, so as not to reduce an aperture ratio.

Referring to FIGS. 1 and 2 again, the gate wiring 22 and 24 and the storage wiring 28, may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) and a molybdenum alloy, chrome (Cr), titanium (Ti), Tantalum (Ta) or the like. Further, the gate wiring 22 and 24 and the storage wiring 28 and 29 may have a multilayer structure including two electrically conductive layers (not shown) which have different physical properties. In addition, the gate wiring 22 and 24 and the storage wiring 28 and 29 may be formed by applying PEDOT (PolyEthyleneDiOxyThiophene), which is an electrically conductive organic polymer material, in a coating method, or by printing the same using an inject-printing method.

The gate insulating film 30, made of inorganic insulating material such as silicone oxide (SiOx) or silicone nitride (SiNx), or organic insulating material such as BCB (Benzo-CycloButene), acrylic material or polyamide, covers the gate wiring 22 and 24 and the storage wiring 28 and 29 on the first insulating substrate 1.

The active layer 40, made of hydrogenated amorphous silicone, polycrystalline silicone or electrically conductive organic material, is partially formed in an upper portion of the gate insulating film 30.

The active layer 40 may have various shapes including an island shape and a linear shape. For example, when the active layer 40 is formed in the shape of an island as in the present embodiment, it overlaps the gate electrode 24 on the gate electrode 24 and at least partially overlaps the source electrode 65 and the drain electrode 66, as will be described below. The shape of the active layer 40 is not limited to an island shape, but can be many shapes. When the active layer is formed in a linear shape, it is positioned underneath the data line 62 and may have a shape extending up to above the gate electrode 24.

The ohmic contact layers 55, 56 may be formed on the active layer 40. The ohmic contact layers 55, 56 are made of n+ hydrogenated amorphous silicone highly doped with n-type impurities, ITO material doped with p-type impurities, or others. The ohmic contact layers 55, 56 are positioned in pairs on the active layer 40, thereby improving a contact characteristic between the active layer 40 and the source and drain electrodes 65, 66 as will be described below. When the contact characteristic between the active layer 40 and the source and drain electrodes 65, 66 formed thereon is good, the ohmic contact layers 55, 56 may be omitted.

The data wiring 62, 65, 66, and 67 are formed on the active layer 40 and the gate insulating film 30. The data wiring 62, 65, 66, and 67 is arranged substantially in the second direction, for example, in a longitudinal direction. The data wiring 62, 65, 66, and 67 includes a data line 62 intersecting the gate line 22 in an insulated manner to thereby define a pixel, the source electrode 65 branching off from the data line 62 and extending up to above the active layer 40, and the drain electrode 66 separated from and facing the source electrode 65.

The data line 62 is arranged in a longitudinal direction, intersects the gate line 22, and is applied with a data signal.

The source electrode 65 may branch off from the data line 62 along a J-shaped path, and at least partially overlaps the active layer 40.

One end of the drain electrode 66 is positioned in a recessed portion of the J-shaped source electrode 65 and at least partially overlaps the active layer 40.

An enlarged drain electrode portion 67, formed wider than the drain electrode 66, extends from one end of the drain electrode 66, and is electrically connected to the pixel electrode 82. The enlarged drain electrode portion 67 is formed outside of a pixel area so as not to reduce an aperture ratio. In order to minimize the aperture ratio, a region extending from one end of the drain electrode 66 to the enlarged drain electrode portion 67 is formed in a linear shape and overlaps the horizontal portion 28 of the storage wiring 28 and 29. The pixel area refers to an area defined by the gate wiring 22 and 24 and the data wiring 62, 65, 66, and 67. The pixel area may be understood as an area through which light emitted from the backlight assembly passes. Thus, the color filter area (see reference numeral "130" in FIG. 3) of the color filter substrate (see reference numeral "2" in FIG. 5), which corresponds to the pixel area of the TFT substrate, may also be understood as a pixel area.

The data wiring 62, 65, 66, and 67 may be made of a refractory metal such as chrome, a molybdenum-based metal, tantalum and titanium, and may also have a multilayer structure consisting of, for example, a lower layer (not shown), which is formed of the refractory metal or the like, and an upper layer (not shown), which is formed of a low-resistivity material and located on the lower layer. An example of the multilayer structure includes a double layer of a lower chrome layer and an upper aluminum layer or a lower aluminum layer and an upper molybdenum layer, and a triple layer of molybdenum-aluminum-molybdenum layers.

The protective film 70 is formed on the data line 62, the drain electrode 66 and an exposed semiconductor layer 40. The protective film 70 is made of an inorganic material consisting of silicone nitride or silicone oxide, an organic photosensitive material having a good planarization characteristic, a low-dielectric insulating material such as a-Si:C:O and a-Si:O:F formed by plasma enhanced chemical vapor deposition (PECVD), or others. Further, the protective film 70 may have a double layer structure of a lower inorganic layer and an upper organic layer in order to make the most of superior characteristics of the organic layer, and simultaneously protect the exposed semiconductor layer 40.

The protective film 70 is formed with a contact hole 72 through which the enlarged drain electrode portion 67 is exposed.

The pixel electrode 82 is formed on the protective film 70, and is electrically connected to the drain electrode 66 through the contact hole 72. A drain-electrodes-connecting portion 82a is formed on one side of the pixel electrode 82. This portion 82a is electrically connected to the drain electrode 66, in particular, to the enlarged drain electrode portion 67 through the contact hole 72, and a data voltage is applied thereto via the drain electrode 66. In order not to reduce the aperture ratio, the drain-electrode-connecting portion 82a may project outside of the pixel area through which light emitted from the backlight assembly passes.

The pixel electrode 82 may be made of a transparent, electrically conductive material such as ITO (Indium Tin Oxide) or IZO (Indium Zinc Oxide), or a reflective, electrically conductive material such as aluminum.

Referring to FIGS. 4 and 5, when a data voltage is applied to the pixel electrode 82, the pixel electrode 82, together with a common electrode 140 of the color filter substrate, generates an electric field, thereby determining the orientation of liquid crystal molecules of the liquid crystal layer 3.

Figure 3:
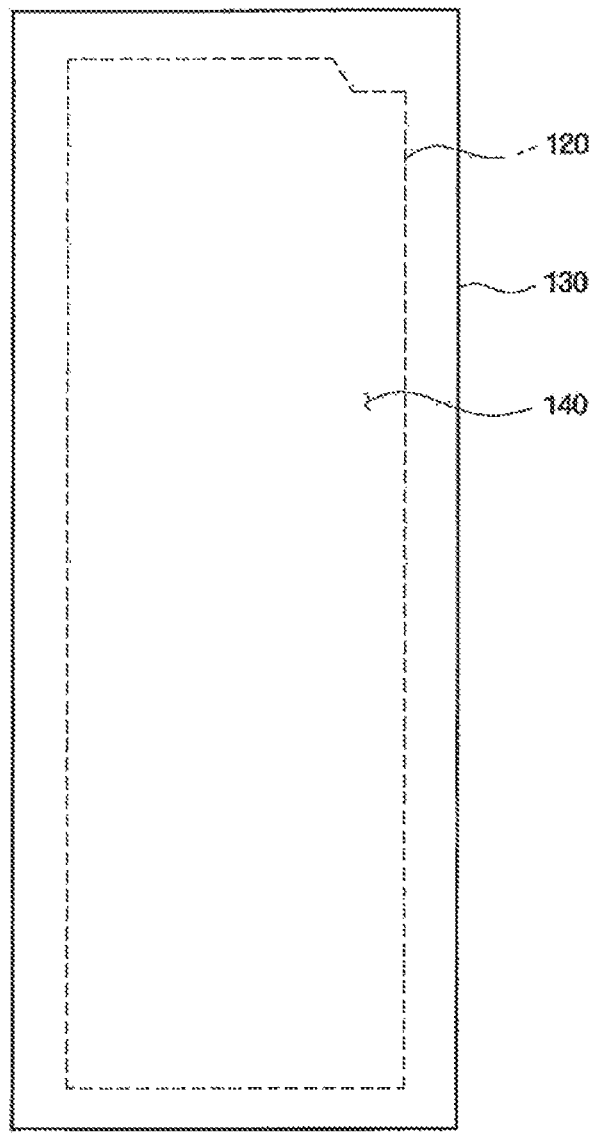
FIG. 3 is a layout view of a color filter substrate included in the LCD device in accordance with the first preferred embodiment of the present invention.

Reference will now be made to the color filter substrate included in the LCD device according to the present embodiment with reference to FIGS. 3 to 5.

The color filter substrate includes a black matrix 120, a color filter 130, an overcoat film (not shown), a common electrode 140, and others, all of which are formed on the lower surface of a second insulating substrate 100, and is disposed to face the TFT substrate.

The second insulating substrate 100 of the color filter substrate may be made of heat-resistant, optically transparent material such as transparent glass or plastic.

The black matrix 120, made of an opaque material such as chrome, is formed on the insulating substrate according to the present embodiment to partition a pixel area.

The black matrix 120 is arranged in the shape of a matrix along first and second directions, and its width $W_3$ in the second direction, for example, in a longitudinal direction, is substantially the same as that of the vertical portion 29 of the storage wiring 28 and 29, as stated above.

The pixel area partitioned by the black matrix 120 is successively formed of red, green and blue color filters 130. The color filters 130 are made of materials transmissive to light of different colors, and thus functions to transmit therethrough light of a specific wavelength band.

The color filters 130 may be disposed in a stripe, mosaic or delta pattern, but stripe-patterned color filters 130 will be described by way of example in the present embodiment. In the stripe-patterned color filters 130, color filters of the same color are disposed in the second direction, for example, in a longitudinal direction. That is, viewed in the first direction, for example, in a transverse direction, an nth (n is an integer) color filter may be a red color filter, an (n+1)th color filter may be a green color filter, and an (n+2)th color filter may be a blue color filter.

The overcoat film is formed on the color filters 130. The common electrode 140, made of transparent, electrically conductive material such as ITO or IZO, is formed on the overcoat film. Further, although not shown in the drawings, a spacer for providing a definite gap between the common electrode 140 and the TFT substrate may be formed on the pixel electrode 82, and the gap left by the spacer is filled with the liquid crystal layer 3.

Figure 6:
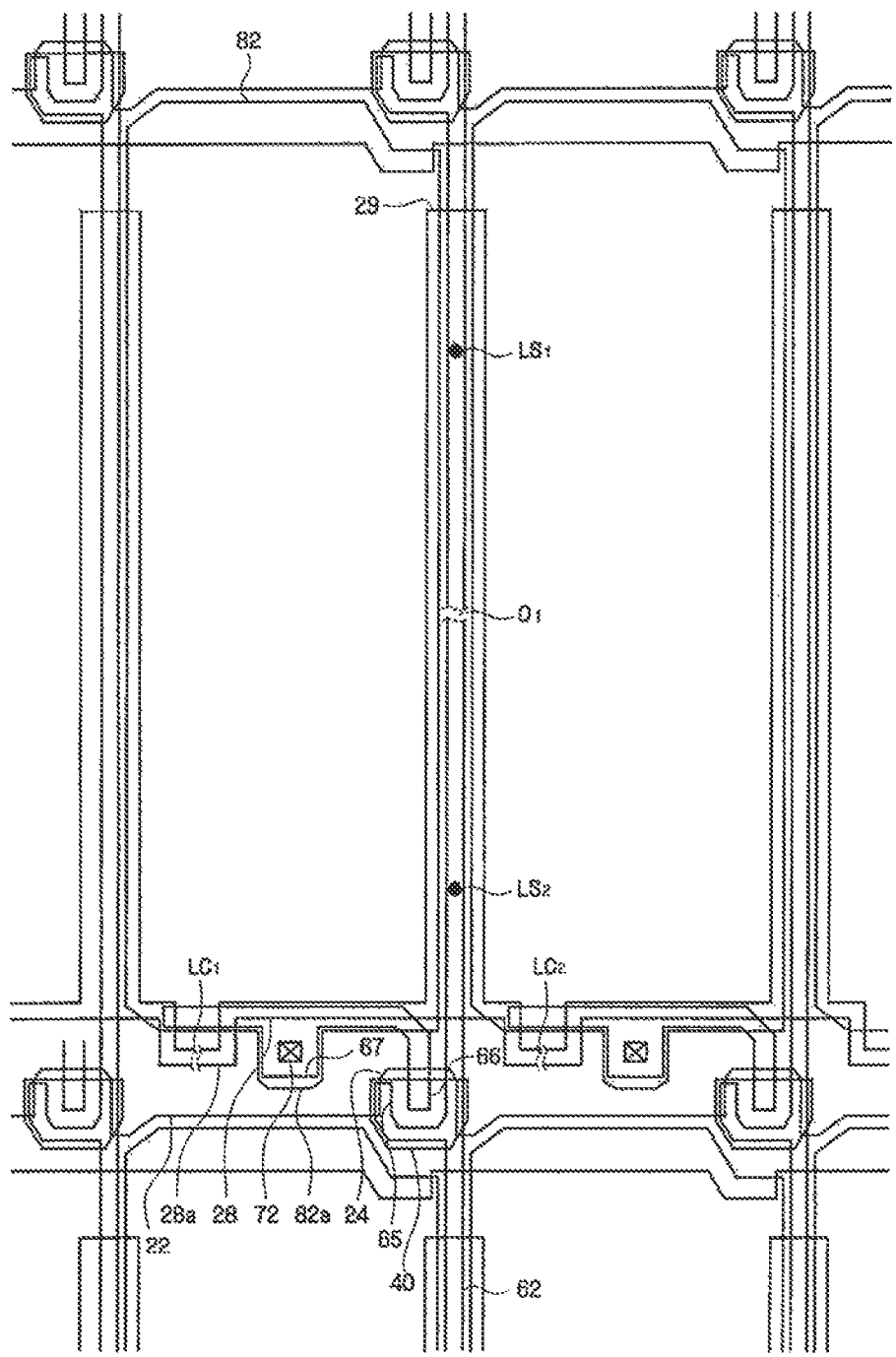
FIG. 6 is a view schematically illustrating a method of repairing an open when an open occurs in a data line of the TFT substrate of FIG. 1.
Figure 7:
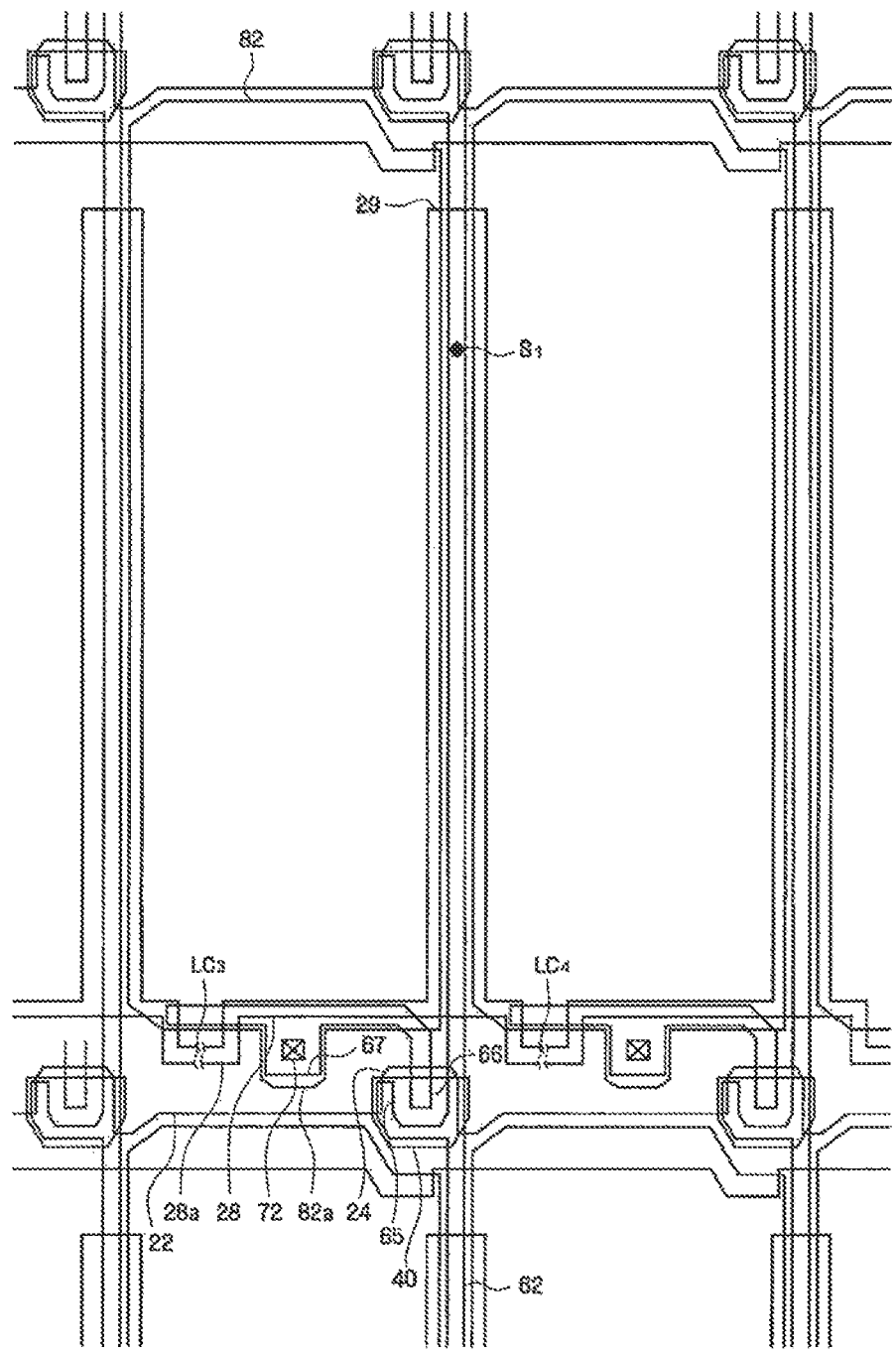
FIG. 7 is a view schematically illustrating a method of repairing a short when the short occurs in a data line of the TFT substrate of FIG. 1.
Figure 8:
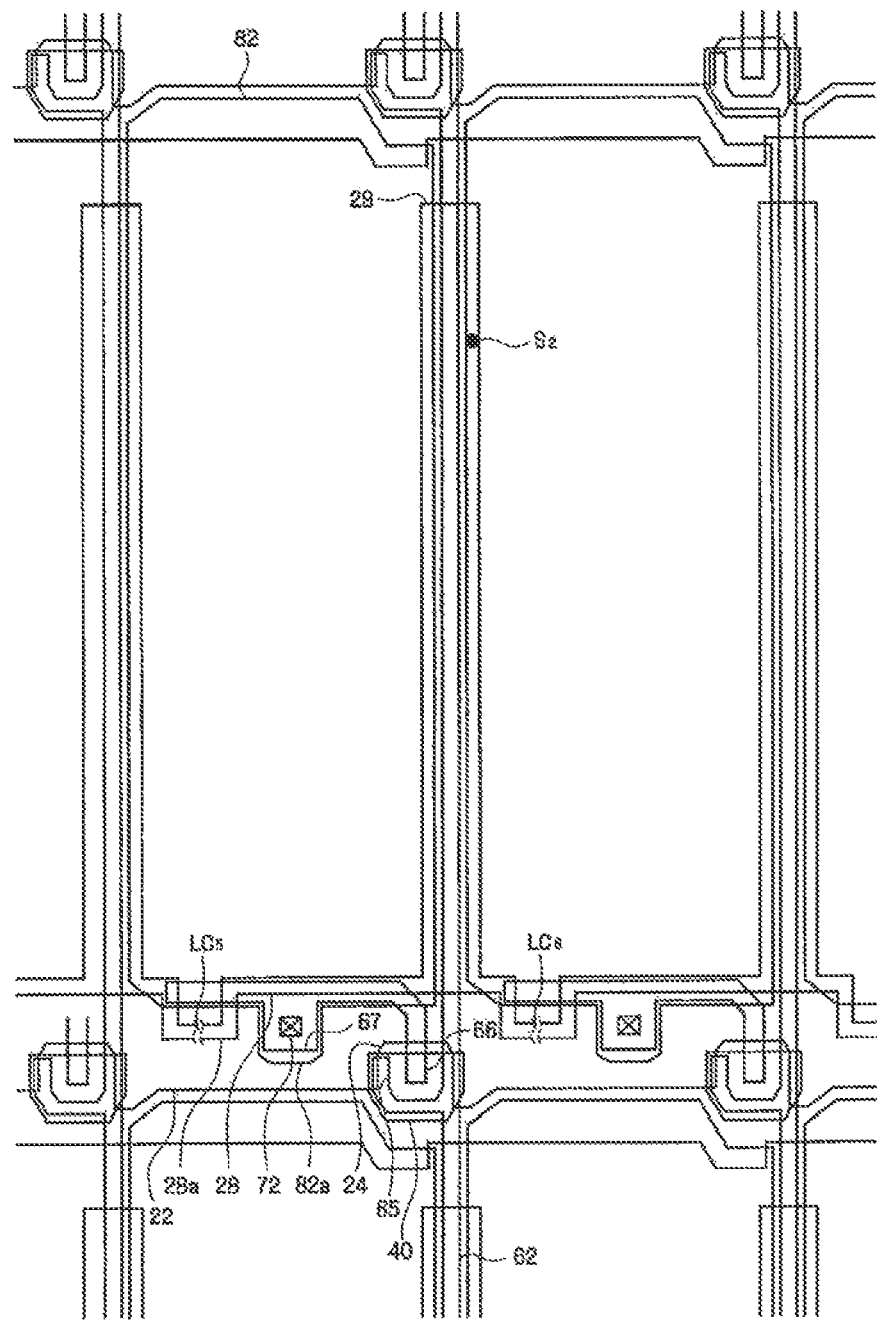
FIG. 8 is view schematically illustrating a method of repairing a short when the short occurs in a pixel electrode of the TFT substrate of FIG. 1.

Reference will now be made in detail to a method of repairing bad pixels when pixel defects occur in the LCD device, with reference to FIGS. 6 to 8. FIG. 6 schematically illustrates a method of repairing an open when the open occurs in the data line of the TFT substrate in FIG. 1, FIG. 7 schematically illustrates a method of repairing a short when the short occurs in the data line of the TFT substrate in FIG. 1, and FIG. 8 schematically illustrates a method of repairing a short when the short occurs in the pixel electrode of the TFT substrate in FIG. 1.

Since the TFT substrate includes a plurality of wirings and a plurality of electrodes, an open may occur in the individual wirings and electrodes or a short may occur between the wirings or between the wirings and the electrodes.

Specifically, if an open region $O_1$ occurs in the data line 62, all pixels connected to the opened data line 62 will not operate.

In order to repair such pixel defects, a laser beam is irradiated through the data line 62 and the storage wiring 28 and 29 corresponding to both sides of the open region $O_1$ to thereby form laser short regions $LS_1$ and $LS_2$. The laser beam forms the laser short regions $LS_1$ and $LS_2$ by partially melting the data line 62 and the storage wiring 28 and 29, and thus the data line 62 and the storage wiring 28 and 29 are electrically connected to each other. As a result of this, a signal applied through the data line 62 does not pass through the open region $O_1$, but a separate current path, that is, a bypass to the vertical portion 29 of the storage wiring 28 and 29 via the laser short regions $LS_1$ and $LS_2$, is formed, so that bad pixels can be easily repaired. For example, a laser beam belonging to a green wavelength band (about 532 nm) may be used in repairing the pixel defects, and a laser beam with a power of 0.1 to 1 mJ may be applied for melting the data line 62 and the vertical portion 29 of the storage wiring 28 and 29. The diameter of the laser beam spot may be ranged from 1 to 4 μm, for example.

However, if only the above-mentioned method step is performed, a data signal applied through the data line 62 is transferred to the storage wiring 28 and 29, and thus interferes with a storage voltage signal applied to the storage wiring 28 and 29, which may have a negative influence on other good pixels. Thus, it is preferable to cut the storage wiring 28 and 29 of the corresponding bad pixel. Specifically, a laser beam is irradiated onto a part not overlapping the pixel electrode 82, that is, the bent portion 28a, of the horizontal portion 28 of the storage wiring 28 and 29 to thereby form laser cut regions $LC_1$ and $LC_2$, and thus the storage wiring 28 and 29 is cut. Here, all the bent portions 28a of pixel areas adjacent to both sides of the cut data line 62 are formed with the laser cut regions $LC_1$ and $LC_2$. That is, when one data line 62 is opened, the laser cut regions $LC_1$ and $LC_2$, are formed in two bent portions 28a positioned on both sides of the cut data line 62. By cutting the part not overlapping the pixel electrode 82, that is, the bent portion 28a, it is possible to prevent signal interference with other pixels, which may arise in the bad-pixel repair process.

In the present embodiment, by using a laser beam and providing the storage wiring 28 and 29 with the bent portion 28a not overlapping the pixel electrode 82, the above-mentioned signal interference due to a short between the data line 62 and the source electrode 65 positioned thereunder or a further short of the very thin data line 62 can be prevented, as compared to a case where, in order to repair the open data line 62, open portions of the data line 62 are connected to each other by using CVD.

As illustrated in FIG. 7, since the overlapping area between the data line 62 and the storage electrode 82 is large, they are highly likely to be shorted by particles, etc. If a short region $S_1$ occurs between the data line 62 and the storage wiring 28 and 29, all storage wiring 28 and 29 connected to the shorted data line 62 are attacked by the above-mentioned signal interference, which results in pixel defects.

In such a case, since the horizontal portion 28 of the storage wiring 28 and 29 is formed with the bent portion 28a projecting beyond an edge of the pixel electrode, laser cut regions $LC_3$ and $LC_4$ can be formed in the bent portions 28a of pixel areas adjacent to both sides of the shorted data line 62. That is, when one data line 62 is shorted, laser cut regions $LC_3$ and $LC_4$ are formed in two bent portions 28a, positioned on both sides of the shorted data line 62, respectively, thereby preventing signal interference from occurring in the storage wiring 28 and 29 and the data wiring 62, 65, 66, and 67.

In this way, when a short occurs between the data line 62 and the vertical portion 29 of the storage wiring 28 and 29, the TFT substrate according to the present embodiment enables the laser cut regions $LC_3$ and $LC_4$ to be easily formed in the horizontal portion 28 of the storage wiring 28 and 29, which adjoins the short region SI, because the storage wiring 28 and 29 is formed with the bent portion 28a projecting beyond an edge of the pixel electrode 82. Consequently, pixel defects caused by the shorted data line can be easily repaired.

As illustrated in FIG. 8, if a short region S2 occurs between the storage wiring 28 and 29 and the pixel electrode 82 by particles, etc., an undesired storage voltage is applied to the pixel electrode 82, resulting in pixel defects.

In such a case, since the horizontal portion 28 of the storage wiring 28 and 29 is formed with the bent portion 28a projecting beyond an edge of the pixel electrode, laser cut regions $LC_5$ and $LC_6$ can be formed in the bent portions 28a of pixel areas adjacent to both sides of the shorted storage wiring 28 and 29. That is, when one storage wire is shorted, laser cut regions $LC_5$ and $LC_6$ are formed in two bent portions 28a, positioned on both sides of the shorted data line 62, respectively. Thus, all pixels connected to the shorted storage wiring 28 and 29 can be prevented from suffering from pixel defects.

In the TFT substrate according to the present embodiment, when a short occurs between the pixel electrode 82 and the storage wiring 28 and 29, the laser cut regions $LC_5$ and $LC_6$ can be easily formed in the storage wiring 28 and 29 because the storage wiring 28 and 29 is formed with the bent portion 28a projecting beyond an edge of the pixel electrode 82. Consequently, all pixels connected to the shorted storage wiring 28 and 29 can be prevented from suffering from pixel defects. In such a bad-pixel-repair method, bad pixels can be repaired without turning off the bad pixels by irradiating a laser beam onto the defective pixel electrode 82 to generate a short between the pixel electrode 82 and the gate line 22.

Figure 9:
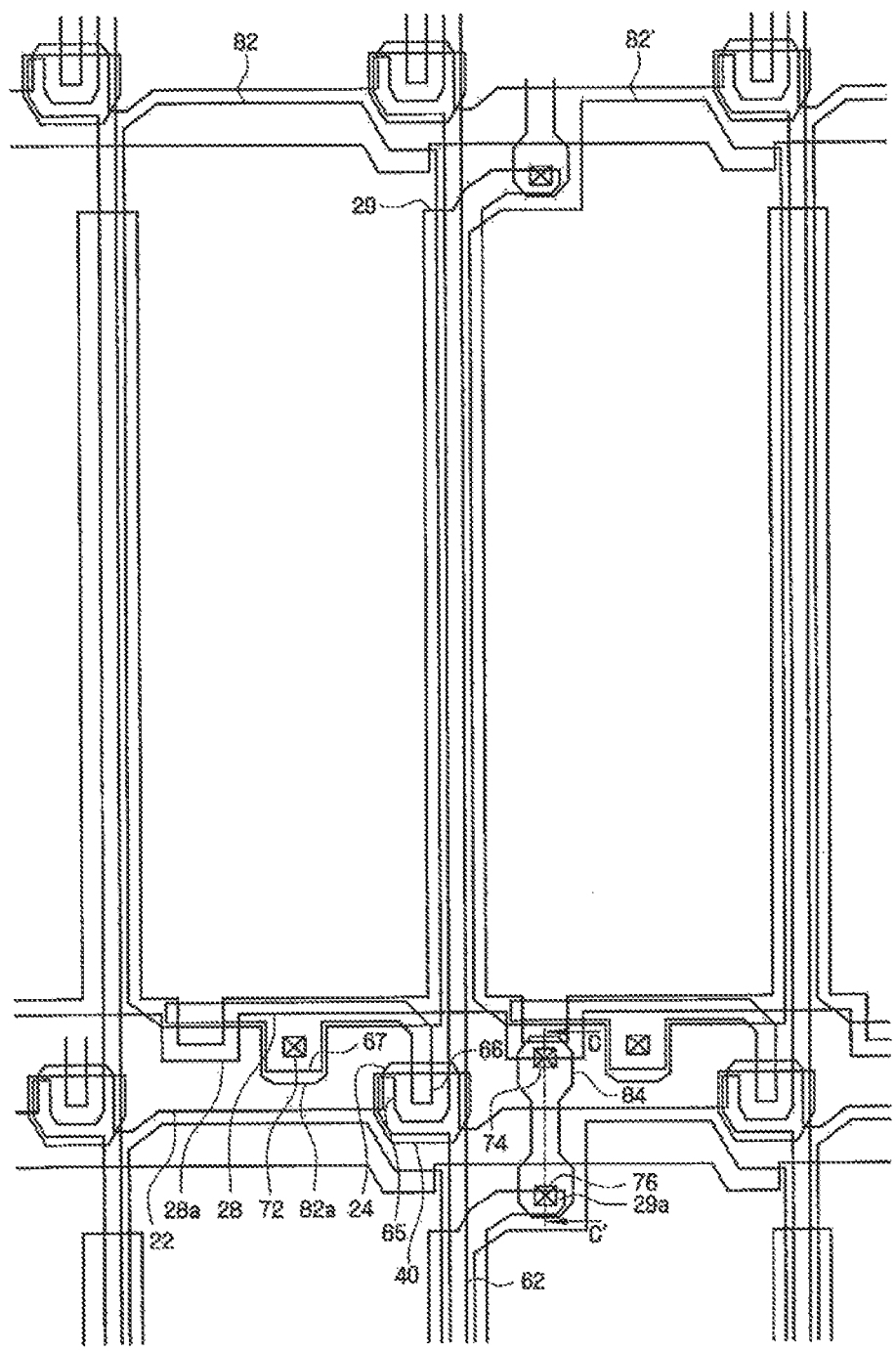
FIG. 9 is a layout view of a TFT substrate included in an LCD device in accordance with a second preferred embodiment of the present invention.
Figure 10:
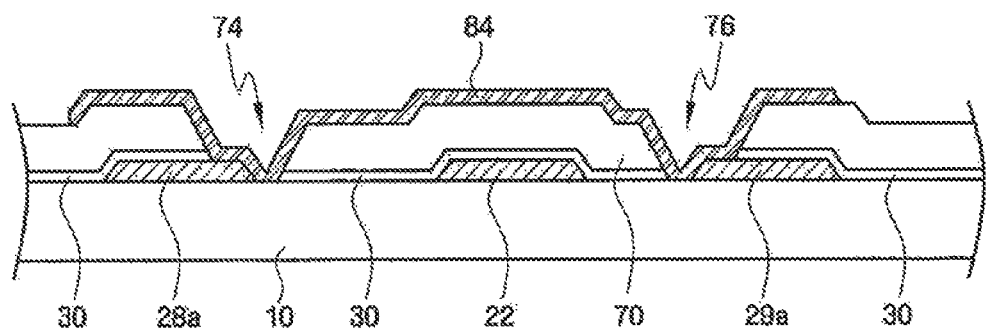
FIG. 10 is a sectional view taken along line C-C' of FIG. 9.

Reference will now be made in detail to a second preferred embodiment of the present invention with reference to FIGS. 9 and 10. FIG. 9 illustrates the layout of a TFT substrate included in an LCD device according to the second embodiment, and FIG. 10 illustrates a section taken along line B-B' of FIG. 9.

For explanatory convenience, the same functional constituents as those illustrated in the drawings of the previous embodiment are designated by the same reference numerals, and thus a description thereof is brief or omitted. As illustrated in FIGS. 9 and 10, the LCD device according to the present embodiment has essentially the same structure as that of the LCD device according to the previous embodiment of the present invention, except that the LCD device according to the present embodiment further includes a bridge electrode 84 connecting the storage wiring 28 and 29 of adjacent pixels to each other.

In the present embodiment, a projection portion 29a is formed at the distal end of the vertical portion 29 of the storage wiring 28 and 29. The projection portion 29a projects toward the pixel electrode 82' and thus is positioned on a vertical line, together with the bent portion 28a of the storage wiring 28 and 29 of an adjacent pixel.

The bridge electrode 84 electrically connects a pair of storage wires 28 and 29 neighboring with respect to the gate wiring 22 and 24. Specifically, the bridge electrode 84 electrically connects the horizontal portion 28 of one of the pair of neighboring storage wiring 28 and 29 to the vertical portion 29 of the other storage wiring 28 and 29. The bridge electrode 84 electrically connects the bent portion 28a and the projection portion 29a of the storage wiring 28 and 29 to each other through bridge electrode contact holes 74, 76. Thus, since the storage wiring 28 and 29 are electrically connected to each other by means of the bridge electrode 84, other pixels can be prevented from being affected by signal delay even when any one of the storage wirings 28 and 29 is cut in order to repair pixel defects. This will be described in detail below.

The bridge electrode 84 is made of substantially the same material as that of the pixel electrode 82' adjacent to the bridge electrode 84, and the bridge electrode 84 and the pixel electrode 82' are formed in substantially the same layer. Specifically, when the pixel electrode 82' is made of transparent, electrically conductive material such as ITO or IZO, the bridge electrode 84 is also formed as an ITO or IZO electrode.

The bridge electrode 84 may be formed in every pixel areas. That is, a pixel area is defined as a red pixel area, a green pixel area or a blue pixel area according to the type of color filter (see reference numeral "130" in FIG. 3) corresponding thereto, and these pixel areas may be formed with the bridge electrode 84. The pixel electrode 82' of the pixel area, in which the bridge electrode 84 is formed, may be narrower than the pixel electrode 82 of the pixel area where the bridge electrode 84 is not formed. That is, in the pixel area where the bridge electrode 84 is formed, the pixel electrode 82' is spaced apart from the bridge electrode 84 by partially cutting a corner of the pixel electrode 82', so as not to be electrically connected to the bridge electrode 84.

The bridge electrode 84 may be formed in all pixel areas, but it is also possible to form the bridge electrode 84 only in one or two pixel area(s) of the red, green and blue pixel areas. Any one pixel area may be the blue pixel area whose contribution to luminance is minimal By forming the bridge electrode 84 in every blue pixel areas whose contributions to luminance are minimal, luminance reduction according to the formation of the bridge electrode 84 can be minimized, and reduction in an aperture ratio can be prevented from being caused by a spacer to be formed in the color filter substrate because the spacer is formed in a portion corresponding to the bridge electrode 84.

Figure 11:
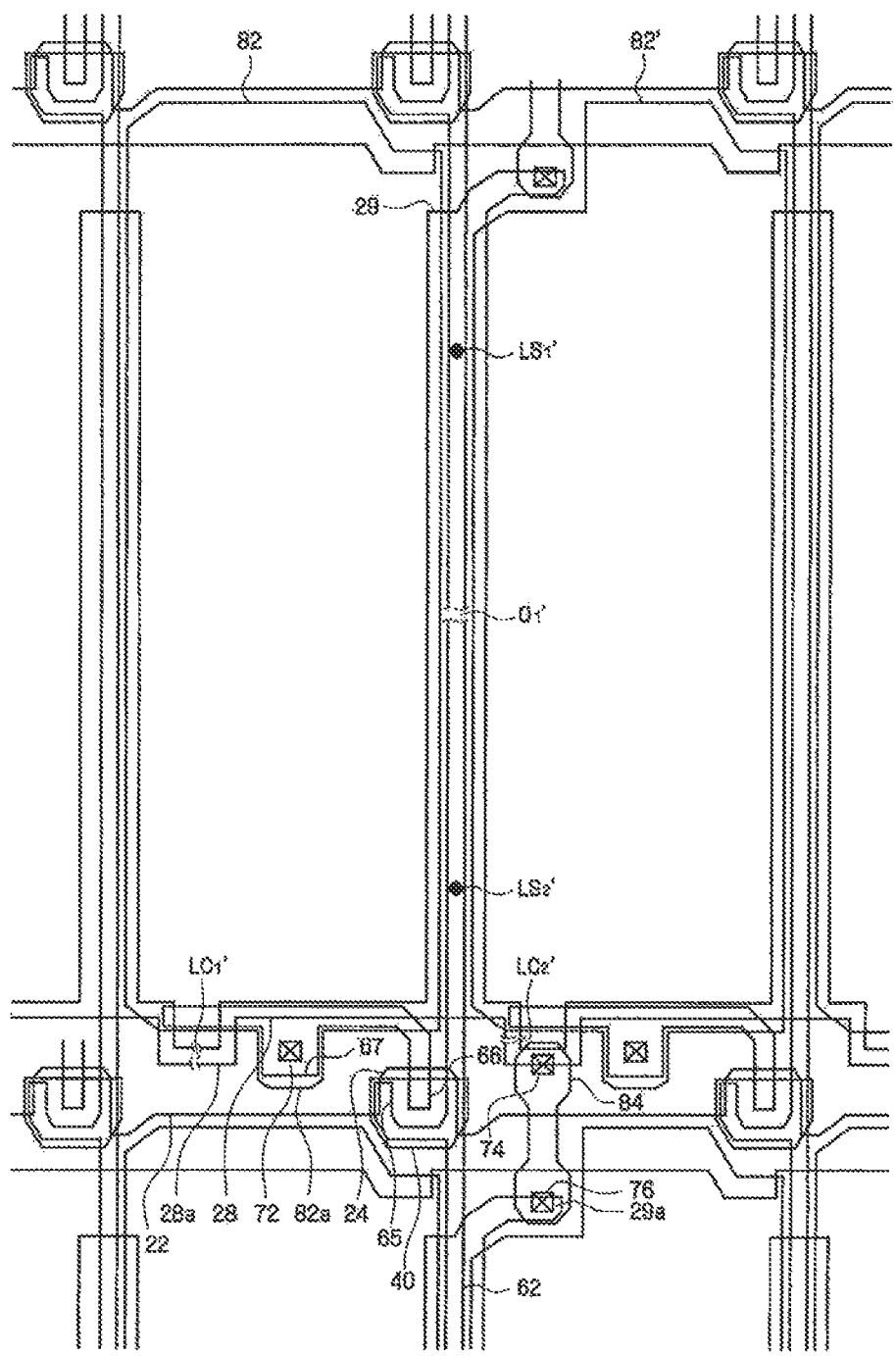
FIG. 11 is a view schematically illustrating a method of repairing an open when the open occurs in a data line of the TFT substrate of FIG. 9.
Figure 13:
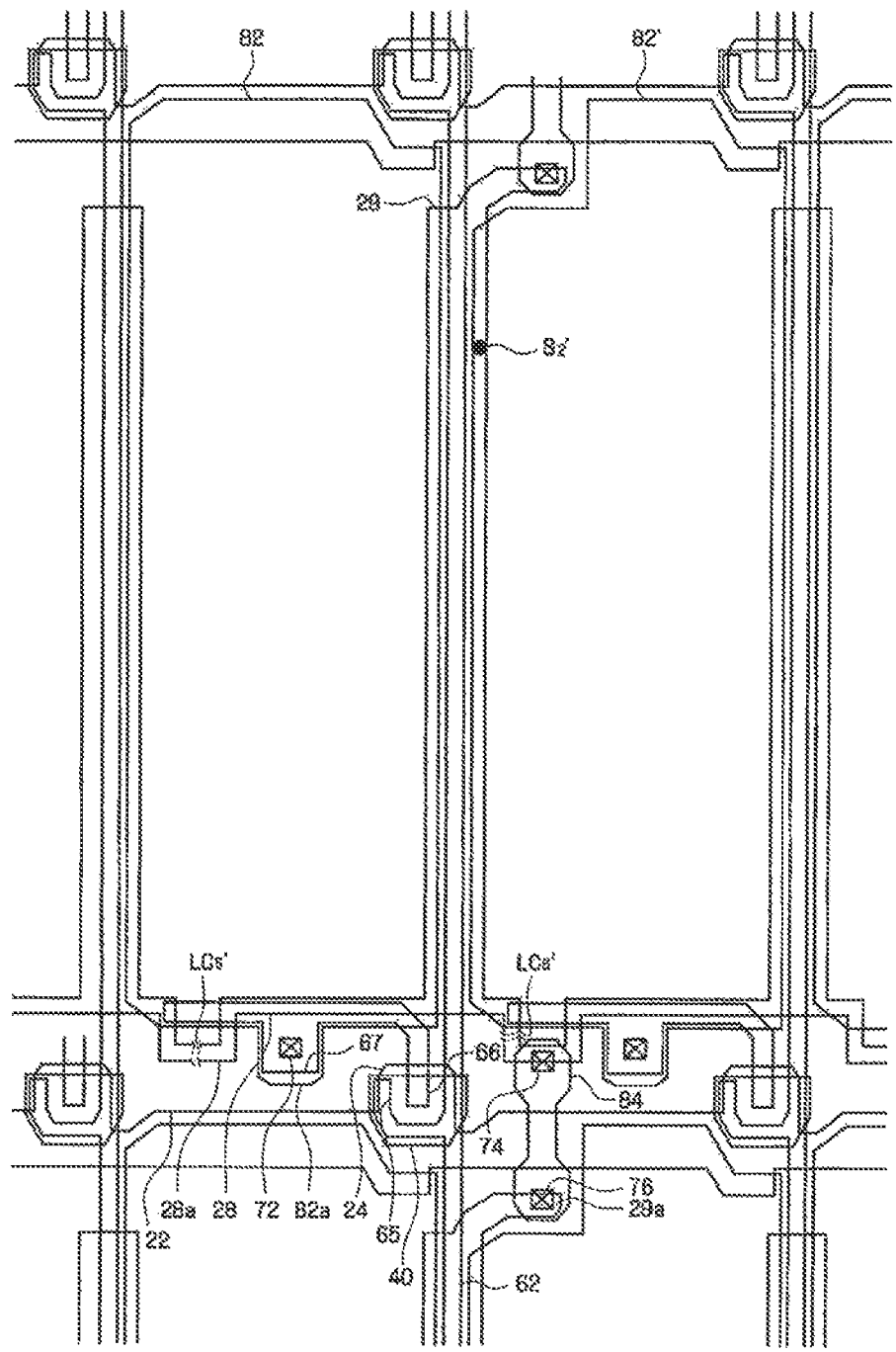
FIG. 13 is view schematically illustrating a method of repairing a short when the short occurs in a pixel electrode of the TFT substrate of FIG. 9.
Figure 14:
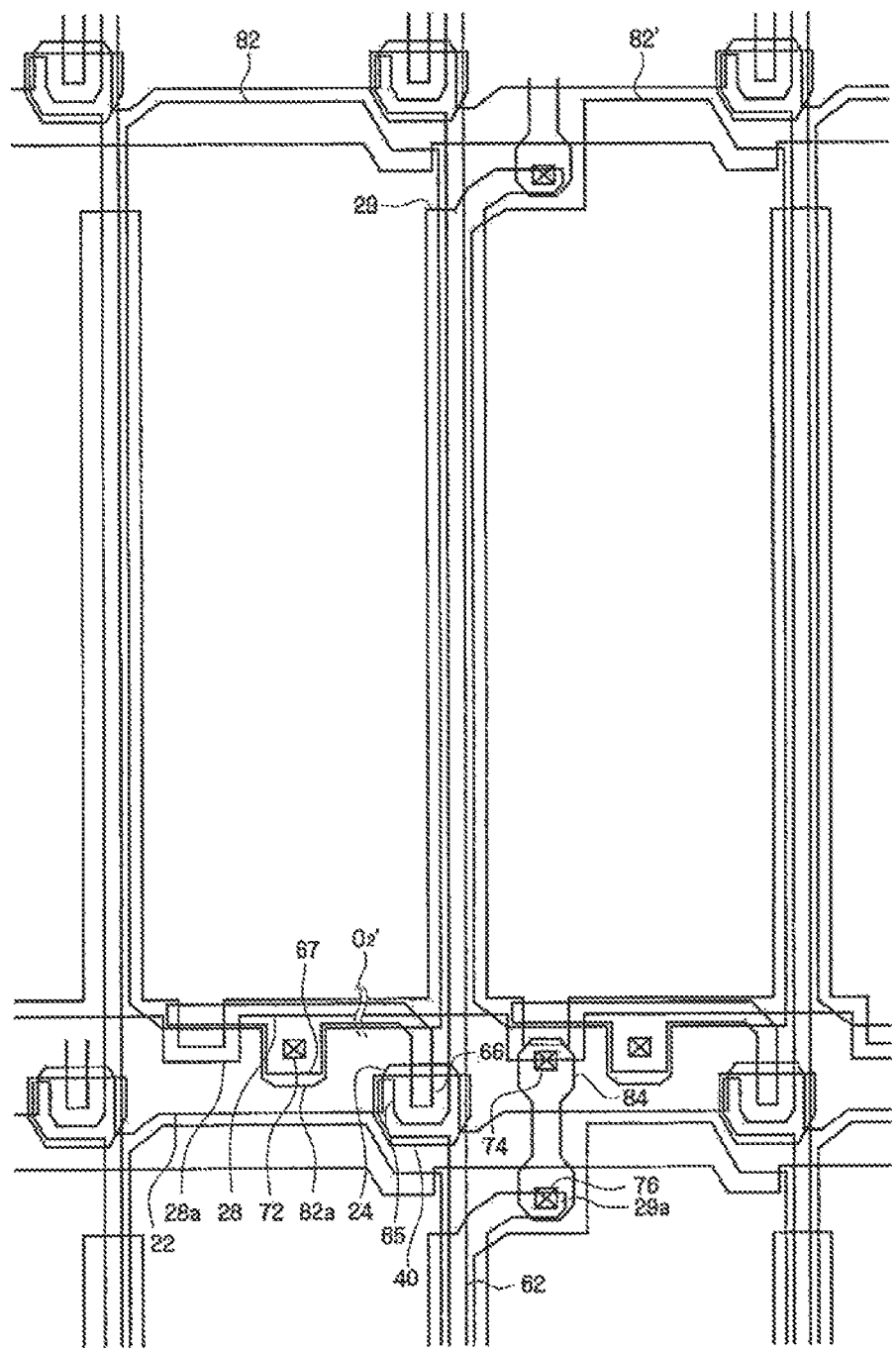
FIG. 14 is a view schematically illustrating how a bridge electrode functions when a short occurs in a storage wiring of the TFT substrate of FIG. 9.

Reference will now be made in detail to a method of repairing bad pixels when pixel defects occur in the LCD device according to the present embodiment, with reference to FIGS. 11 to 14. FIG. 11 schematically illustrates a method of repairing an open when the open occurs in the data line of the TFT substrate in FIG. 9, FIG. 12 schematically illustrates a method of repairing a short when the short occurs in the data line of the TFT substrate in FIG. 9, FIG. 13 schematically illustrates a method of repairing a short when the short occurs in the pixel electrode of the TFT substrate in FIG. 9, and FIG. 14 schematically illustrates how the bridge electrode functions when an open occurs in the storage wiring of the LCD device in FIG. 9.

First, the TFT substrate, in which the bridge electrode 84 is formed, is as described in FIGS. 9 and 10.

As illustrated in FIG. 11, if an open region $O_1'$ occurs in the data line 62, pixel defects occur. In order to repair such pixel defects, laser short regions $LS_1'$, $LS_2'$ are formed by irradiating a laser beam onto the data line 62 and the vertical portion 29 of the storage wiring 28 and 29 corresponding to both sides of the open region $O_1'$, thereby electrically connecting the data line 62 and the storage wiring 28 and 29. Further, laser cut regions $LC_1'$, $LC_2'$ are formed by irradiating a laser beam onto the bent portions 28a of the storage wiring 28 and 29 adjacent to both sides of the opened data line 62. Since the storage wiring 28 and 29, connected to each other in a transverse direction, are applied with the same storage voltage, if the laser cut region $LC1'$ and $LC2'$ exists in the storage wiring 28 and 29 of any one pixel area, the storage voltage of the storage wiring 28 and 29, connected to each other in the first direction, is not transferred to following pixel areas. However, the storage wiring including the laser cut region $LC1'$ and $LC2'$ is electrically connected to the storage wiring 28 and 29, which is disposed in the very next row, by means of the bridge electrode 84, and thus is applied with a storage voltage signal from the storage wiring 28 and 29 disposed in the next row. For this reason, all pixel areas connected to the storage wiring 28 and 29, including the laser cut region $LC1'$ and $LC2'$, can be prevented from being affected by signal delay.

Figure 12:
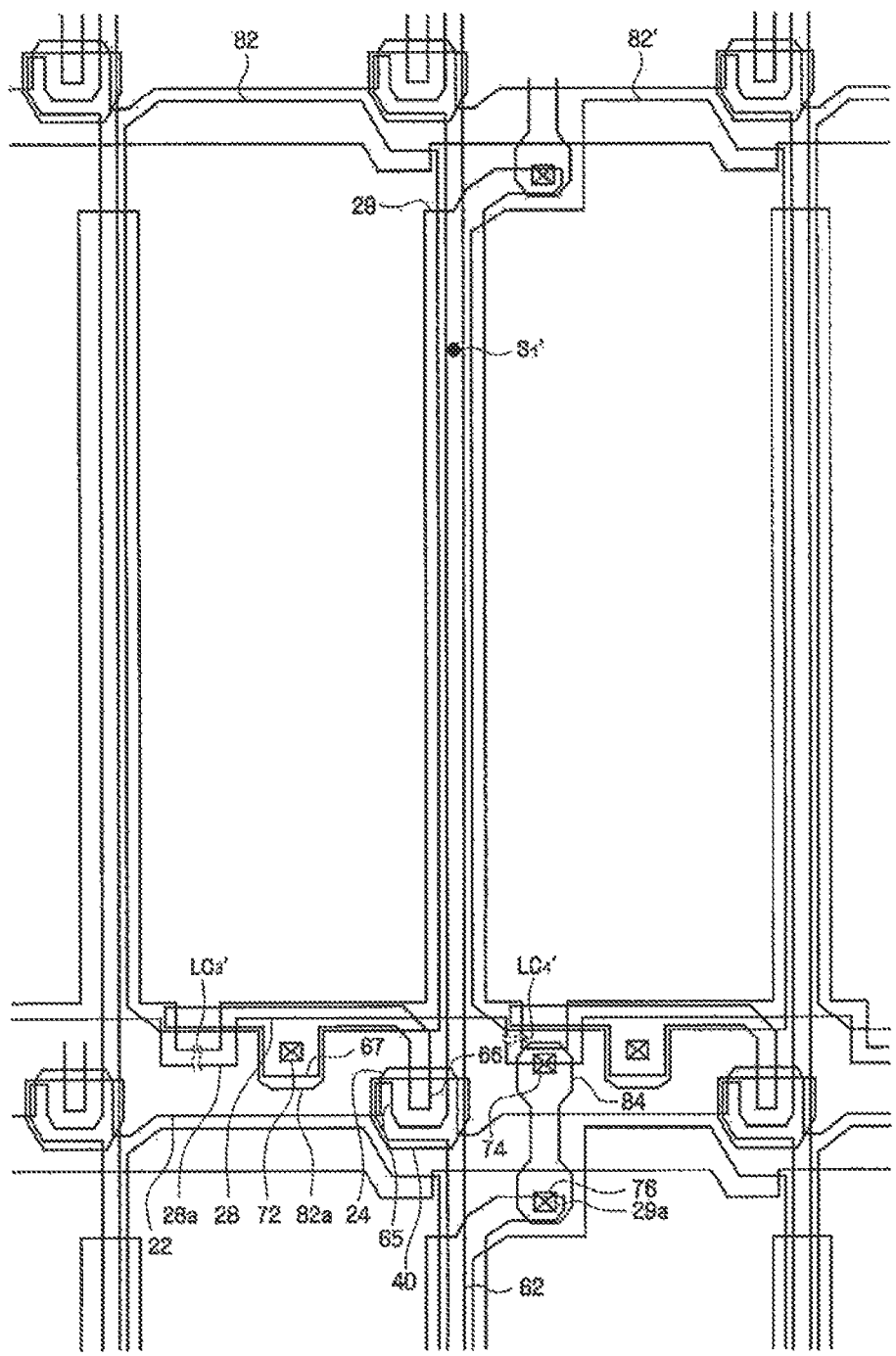
FIG. 12 is a view schematically illustrating a method of repairing a short when the short occurs in a data line of the TFT substrate of FIG. 9.

As illustrated in FIG. 12, if a short region $S_1'$ occurs between the data line 62 and the storage wiring 28 and 29, all storage wiring 28 and 29 connected to the shorted data line 62 are affected by signal interference, which results in pixel defects.

In order to repair such pixel defects, laser cut regions $LC_3'$ and $LC_4'$ are formed in two bent portions 28a positioned on both sides of the shorted data line 62, respectively, thereby preventing signal interference from occurring in the storage wiring 28 and 29 and the data wiring 62, 65, 66, and 67. If only the laser cut region $LC_3'$ and $LC_4'$ exists in any one pixel area, signal delay does not occur in other pixel areas following that pixel area because the storage wirings 38, 39 are electrically connected by means of the bridge electrode 84, which was described with reference to FIG. 1.

As illustrated in FIG. 13, if a short region S2' occurs between the storage wiring 28 and 29 and the pixel electrode 82', laser cut regions $LC_5'$, $LC_6$ are formed in the bent portions 28a adjacent to both sides of the shorted storage wiring 28 and 29, respectively. If only the laser cut region $LC_5'$, $LC_6$ exists in any one pixel area, signal delay does not occur in other pixel areas following that pixel area because the storage wirings 38, 39 are electrically connected by means of the bridge electrode 84, which was described with reference to FIG. 11.

As illustrated in FIG. 14, if an open region $O_2'$ occurs in the storage wiring 28 and 29, for example, the horizontal portion 28 thereof, signal delay occurs in the pixel area where the open region $O_2'$ exists. However, since the storage wiring 28 and 29 of an nth row is electrically connected to the storage wiring 28 and 29 of an (n+1)th row by means of the bridge electrode 84, the storage voltage signal, applied to the storage wiring 28 and 29 of the (n+1)th row, is transferred to the storage wiring 28 and 29 of the nth row. Thus, whichever pixel area of the nth row has an open region $O_2'$, signal delay, a phenomenon in which a storage signal is not transferred to other pixel areas of the same row, cannot occur.

According to the present invention described above, at least one of the following advantageous effects can be obtained:

First, even if bad pixels are caused by an open of the data line, the bad pixels can be securely and easily repaired using the bent portion and the bridge electrode of the storage wiring.

Second, even if bad pixels are caused by a short between the storage wiring and the data line or the pixel electrode, the bad pixels can be securely and easily repaired using the bent portion and the bridge electrode of the storage wiring.

Last, even if the storage wiring is opened, the bridge electrode electrically connects the opened storage wiring to the storage wiring positioned in a different row, and thus the opened storage wiring does not suffer from signal delay.

Although preferred embodiments of the present invention have been described for illustrative purposes, those skilled in the art will appreciate that various modifications, additions and substitutions are possible, without departing from the essential features and the scope and spirit of the invention as disclosed in the accompanying claims. Therefore, it should be appreciated that the embodiments described above are not limitative, but only illustrative.

What is claimed is:

1. A liquid crystal display device comprising:
an insulating substrate;
a gate line arranged in a first direction on the insulating substrate;
a plurality of data lines intersecting and insulated from the gate line and arranged substantially in a second direction;
a thin film transistor connected to the gate line and at least one of the data lines, the thin film transistor having an active layer and source and drain electrodes each at least partially overlapping the active layer;
a pixel electrode electrically connected to the drain electrode; and
a storage wiring having first portions each extending along and overlapping a respective one of the data lines, and a second portion connecting adjacent first portions;
wherein the second portion includes a wiring having a width, the wiring positioned so that the entire width of the wiring extends beyond an edge of the pixel electrode.

* * * * *